(12) United States Patent
Kim et al.

(10) Patent No.: US 6,831,405 B2
(45) Date of Patent: Dec. 14, 2004

(54) ORGANIC ELECTROLUMINESCENCE DEVICE

(75) Inventors: Chang Nam Kim, Seoul (KR); Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/223,659

(22) Filed: Aug. 20, 2002

(65) Prior Publication Data

US 2003/0038589 A1 Feb. 27, 2003

(30) Foreign Application Priority Data

Aug. 21, 2001 (KR) ........................................ P2001-50323

(51) Int. Cl.⁷ ................................................ H01J 1/62
(52) U.S. Cl. ........................ 313/503; 313/505; 313/506; 313/500; 313/504; 315/169.3; 315/169.4; 345/55; 345/44; 345/45
(58) Field of Search ............................. 345/55, 77, 80, 345/36, 33, 44, 45; 313/503, 505, 506, 498, 500, 504; 315/169.3, 169.4

(56) References Cited

U.S. PATENT DOCUMENTS

| | | | | | |
|---|---|---|---|---|---|
| 4,977,350 | A | * | 12/1990 | Tanaka et al. | ............... 313/505 |
| 5,294,869 | A | * | 3/1994 | Tang et al. | ................. 313/504 |
| 5,445,899 | A | * | 8/1995 | Budzilek et al. | ............ 428/690 |
| 6,614,177 | B2 | * | 9/2003 | Kanno et al. | ............... 313/506 |
| 6,657,396 | B2 | * | 12/2003 | Nakada et al. | ........... 315/169.1 |
| 2002/0014837 | A1 | * | 2/2002 | Kim et al. | .................. 313/505 |

* cited by examiner

Primary Examiner—Edward J. Glick
Assistant Examiner—Elizabeth Keaney
(74) Attorney, Agent, or Firm—Fleshner & Kim, LLP

(57) ABSTRACT

Organic EL device including a plurality of data electrode lines on a substrate, a plurality of scan electrode lines perpendicular to the data electrode lines, and an organic EL layer between the plurality of data electrode lines and the plurality of scan electrode lines, wherein each of the data electrode lines is patterned, and divided into three electrode lines, for scanning three pixel groups at a time.

17 Claims, 13 Drawing Sheets

ORGANIC ELECTROLUMINESCENCE DEVICE

This application claims the benefit of the Korean Application No. P2001-0050323 filed on Aug. 21, 2001, which is hereby incorporated by reference.

BACKGROUND OF THE INVENTION

1. Field of the Invention

The present invention relates to an organic EL device, and more particularly, to an organic EL (electroluminescence) device having a high luminous efficiency and a high numerical aperture by reducing a number of scanlines to increase a light emitting time period per a pixel in fabrication of a flat display panel.

2. Background of the Related Art

In a passive matrix organic EL device panel, the higher the resolution, the more the number of pixels, with the more number of scanlines and datalines accordingly. The more a number of scanlines, the shorter the light emitting time period per a pixel, to require a higher instantaneous luminance as much.

Figure 1:
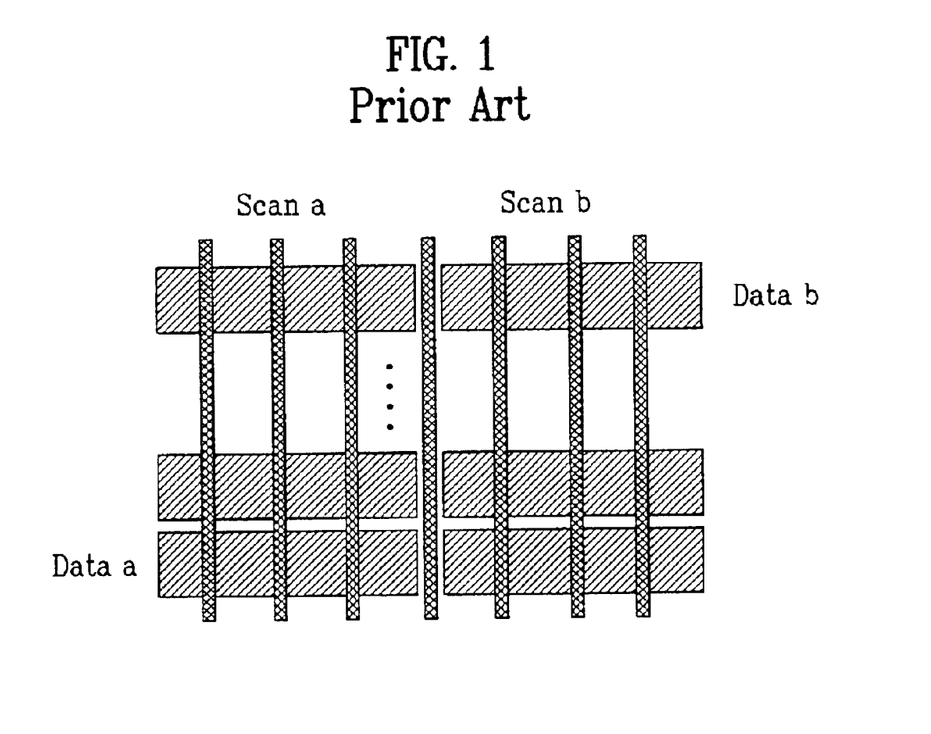
FIGS. 1 and 2 illustrate scan driving concepts of related art organic EL devices.

A positive strip is divided into two as shown in FIG. 1, and made to be scanned individually, for improving a luminous efficiency and a lifetime by reducing a number of scan by half. A positive strip is divided into two in a width direction each with a half width of the present width as shown in FIG. 2, for reducing a number of scanlines by half by forming a scan to have a width two times of the present scan width.

Figure 2:
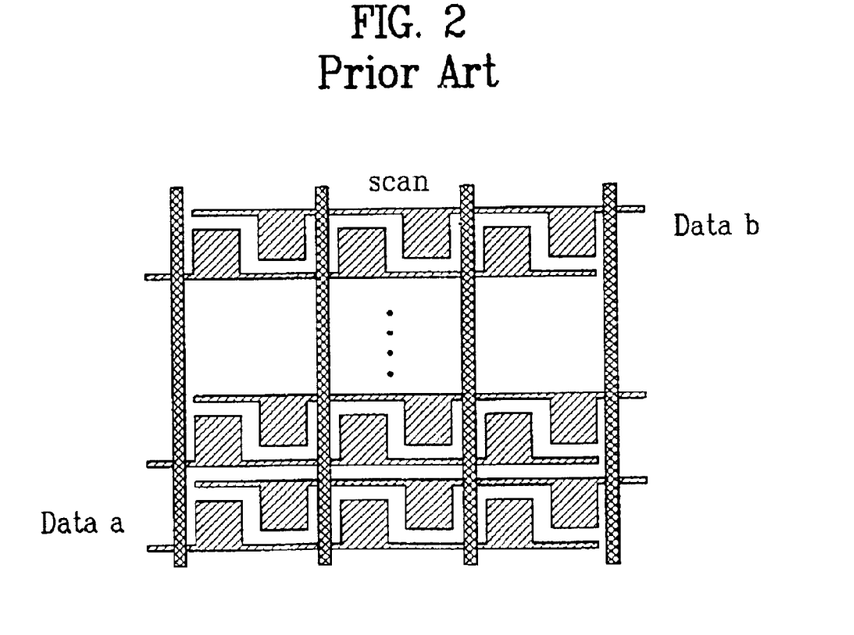

However, the methods in FIGS. 1 and 2 have a problem of high cost since data is divided into two parts, to require two data chips for the two parts. Moreover, the two methods permit to reduce a number of the scanlines to half only.

SUMMARY OF THE INVENTION

Accordingly, the present invention is directed to an organic EL device that substantially obviates one or more of the problems due to limitations and disadvantages of the related art.

An object of the present invention, designed for solving the foregoing problem, is to provide an organic EL device which requires less number of driving chips than the related art method, and increases an numerical aperture in fabrication of a flat display panel of an organic EL.

Another object of the present invention is to provide an organic EL device which can provide an improved device efficiency by dividing a supplementary electrode connected to a dataline into three in a width direction to reduce a number of scanlines, that permits to drive at least three datalines on the same time in one scan, and can reduce a number of dataline chips by leading the dataline to one side.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the organic EL device includes a plurality of data electrode lines on a substrate, a plurality of scan electrode lines perpendicular to the data electrode lines, and an organic EL layer between the plurality of data electrode lines and the plurality of scan electrode lines, wherein each of the data electrode lines is patterned, and divided into three electrode lines, for scanning three pixel groups at a time.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3A:
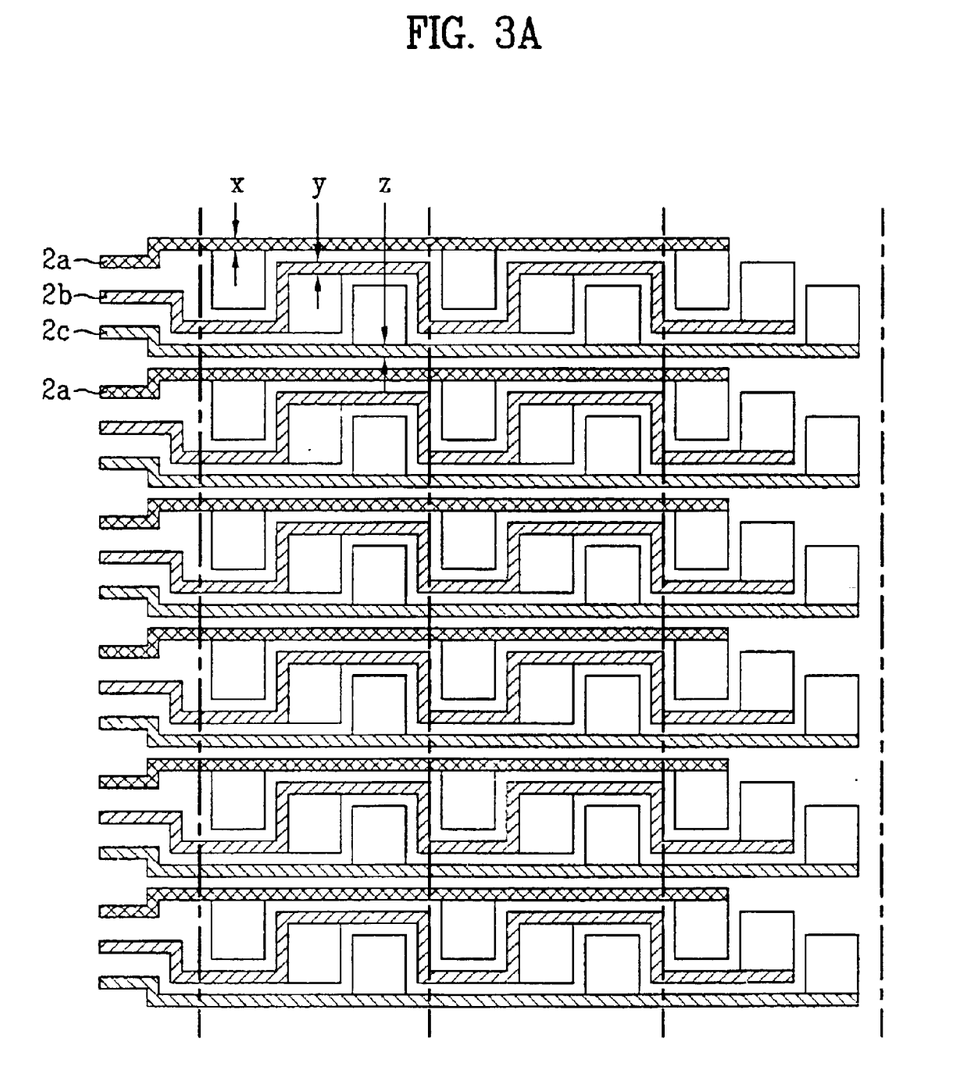
FIGS. 3A–3C illustrate plan views showing the steps of a method for fabricating an organic EL device of triple scan structure in accordance with a first preferred embodiment of the present invention.
Figure 3B:
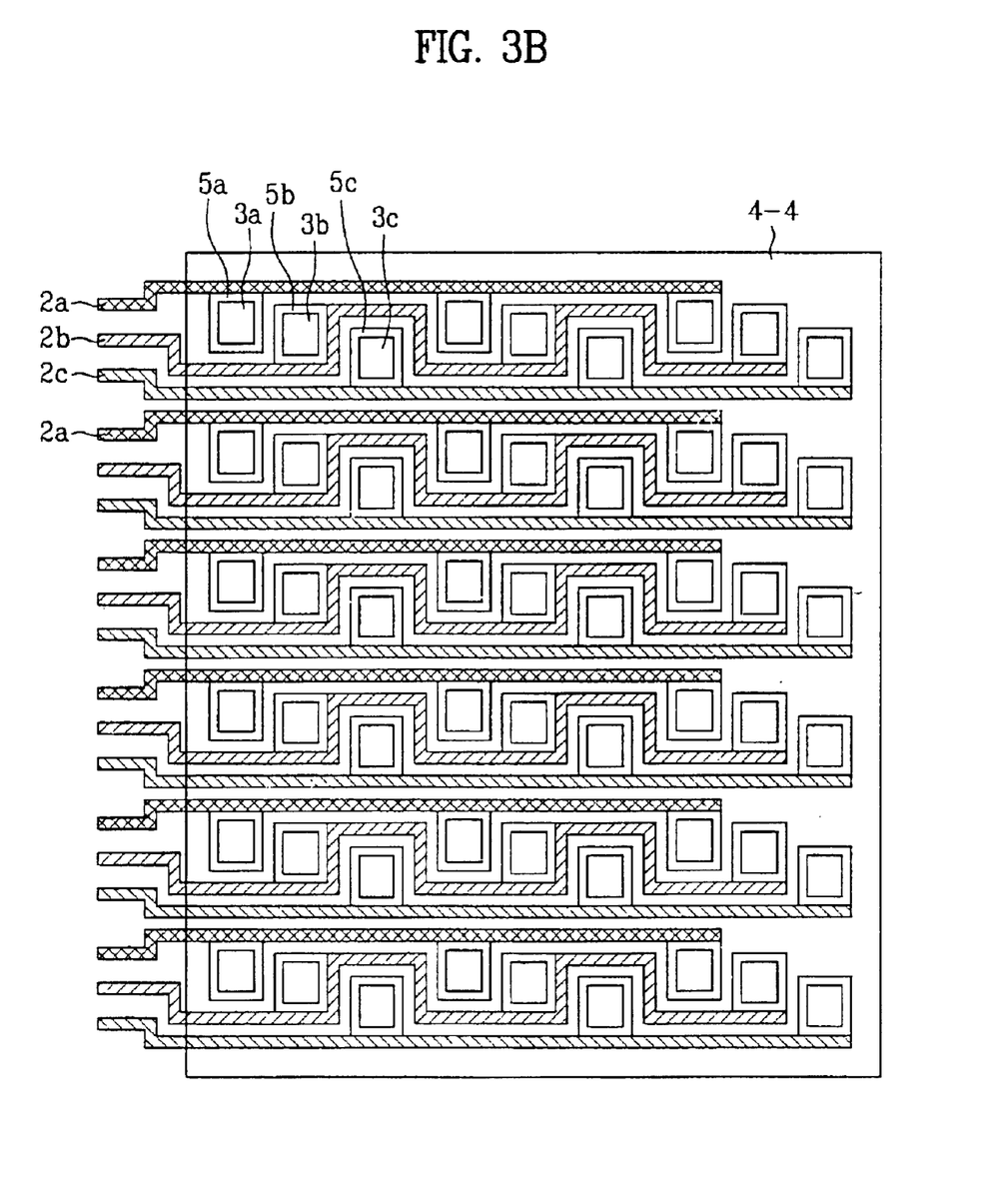
Figure 3C:
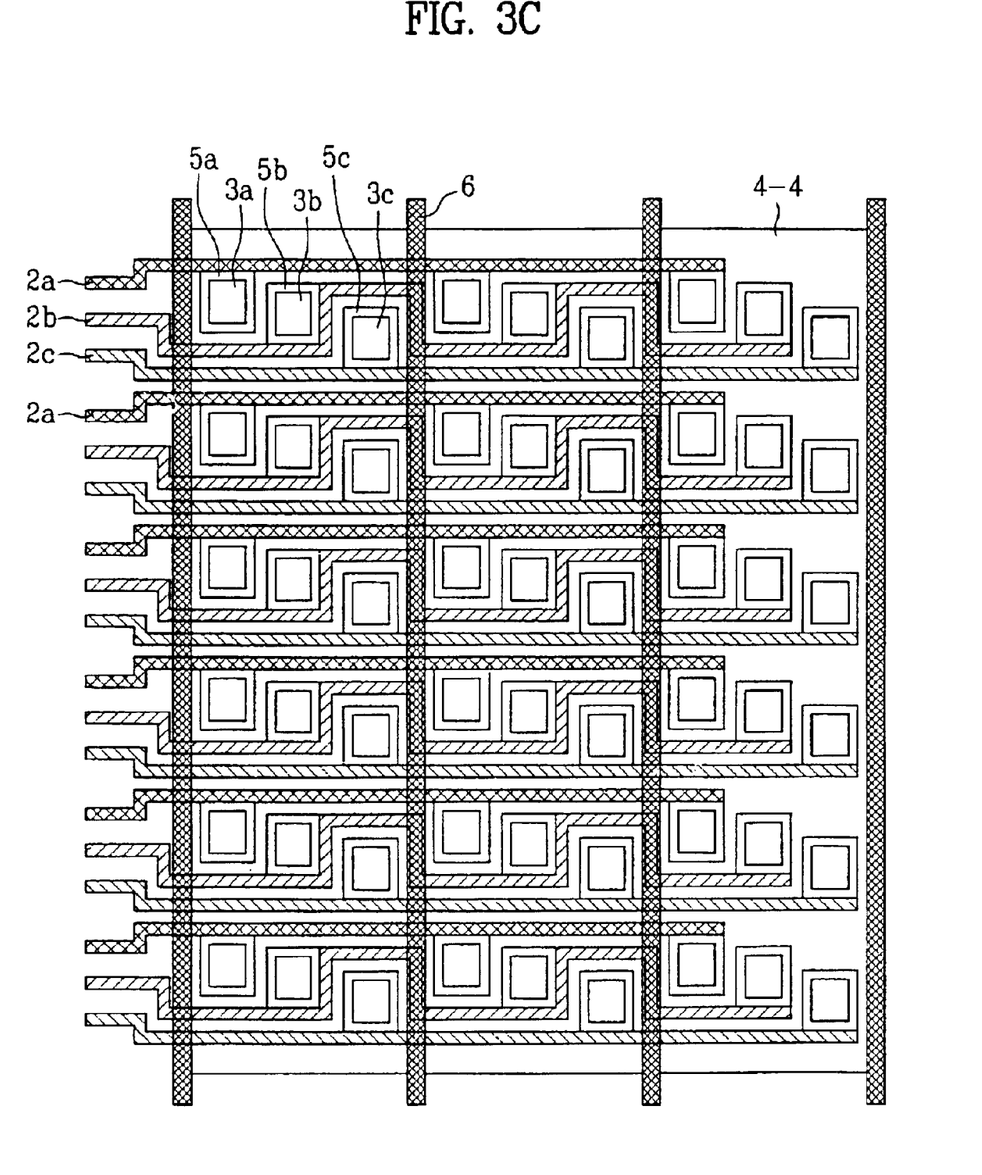

Reference will now be made in detail to the preferred embodiments of the present invention, examples of which are illustrated in the accompanying drawings. FIGS. 3A–3C illustrate plan views showing the steps of a method for fabricating an organic EL device of triple scan structure in accordance with a first preferred embodiment of the present invention.

Referring to FIG. 3C, the organic EL device of triple scan structure includes a plurality of pixels each defined as a region at which a first electrode 5 and a second electrode (not shown) cross, and scanlines each connected to three adjacent groups of pixels each arranged in one direction, for being driven on the same time.

The organic EL device of triple scan structure includes at least three lines of supplementary electrodes formed on a transparent substrate for every one group of pixels in a direction perpendicular to the one direction, with the three lines of the supplementary electrodes respectively having the three adjacent groups of pixels 3a, 3b, and 3c each arranged in one direction connected thereto, first electrodes 5a, 5b, and 5c respectively patterned at the three adjacent groups of pixels 3a, 3b, and 3c so as to be respectively connected to the three lines of the supplementary electrodes 2a, 2b, and 2c, an organic EL layer (not shown) over the first electrodes 5a, 5b, and 5c, and a second electrode on the organic EL layer formed to cross the first electrodes 5a, 5b, and 5c.

Of the three lines of supplementary electrodes, a first line of the supplementary electrode 2a forms a first electrode 5a pattern over the pixel group 3a and the supplementary electrode 2a which controls the pixel group 3a, for controlling the pixel group 3a positioned at first among the pixel groups, a second line of the supplementary electrode 2b forms a first electrode 5b pattern over the pixel group 3b and the supplementary electrode 2b which controls the pixel group 3b, for controlling the pixel group 3b positioned at second among the pixel groups, and a third line of the supplementary electrode 2c forms a first electrode 5c pattern over the pixel group 3c and the supplementary electrode 2c which controls the pixel group 3c, for controlling the pixel group 3c positioned at third among the pixel groups.

An insulating film 4—4 is further included, which is formed on the transparent substrate to cover an edge part of the first electrode 5a, 5b, and 5c patterns, and barriers 6 are further included, each formed for the three groups of pixels arranged in the one direction to isolate the second electrode from each of the three groups of pixels electrically for driving the adjacent three groups of pixels connected to one scanline on the same time.

A method for fabricating the organic EL device will be explained, with reference to FIGS. 3A–3C.

Referring to FIG. 3A, at least three lines of supplementary electrodes 2a, 2b, and 2c are formed for every group of pixels on a transparent substrate, wherein a part of the second supplementary electrode 2b located in the middle is adjacent to the first supplementary electrode 2a with a distance apart, and the other part thereof is adjacent to the first supplementary electrode 2a with a distance apart. That is, the second supplementary electrode 2b is formed in a zigzag form.

Accordingly, as shown in FIG. 3A, line widths of the supplementary electrodes 2a 2b, and 2c may be varied with line resistance. That is, the supplementary electrode 2b in the middle have many turns between other supplementary electrodes 2a and 2c, to have a resistance different from the others, x, y, and z line widths may differ.

Then, referring to FIG. 3B, a transparent conductive material is patterned so as to be electrically connected to the three lines of supplementary electrodes 2a, 2b, and 2c, to form first electrode 5a, 5b, and 5c. Then, an insulating film 4—4 is formed on the transparent substrate to cover an edge part of the first electrode 5a, 5b, and 5c patterns.

A barrier 6 is formed for isolating the second electrode from the every three pixel groups for driving the three pixel groups on the same time as the three pixel groups arranged in one direction are connected to one external scanline (not shown), and an organic EL layer is formed over the first electrodes 5a, 5b, and 5c.

That is, the barrier 6 is formed for every three pixel 3a, 3b, and 3c groups in a direction perpendicular to the supplementary electrodes 2a, 2b, and 2c, the organic EL layer is formed over the first electrodes 5a, 5b, and 5c, and the second electrode (not shown) is formed on the organic EL layer, which is then passivated, and encapsulated, to finished fabrication of a device.

The method further includes the step of connecting a scanline (not shown) to every adjacent three pixel groups in a direction perpendicular to the supplementary electrodes 2a, 2b, and 2c such that the three adjacent pixel groups each arranged in one direction are connected to one scanline to be driven on the same time.

Figure 4:
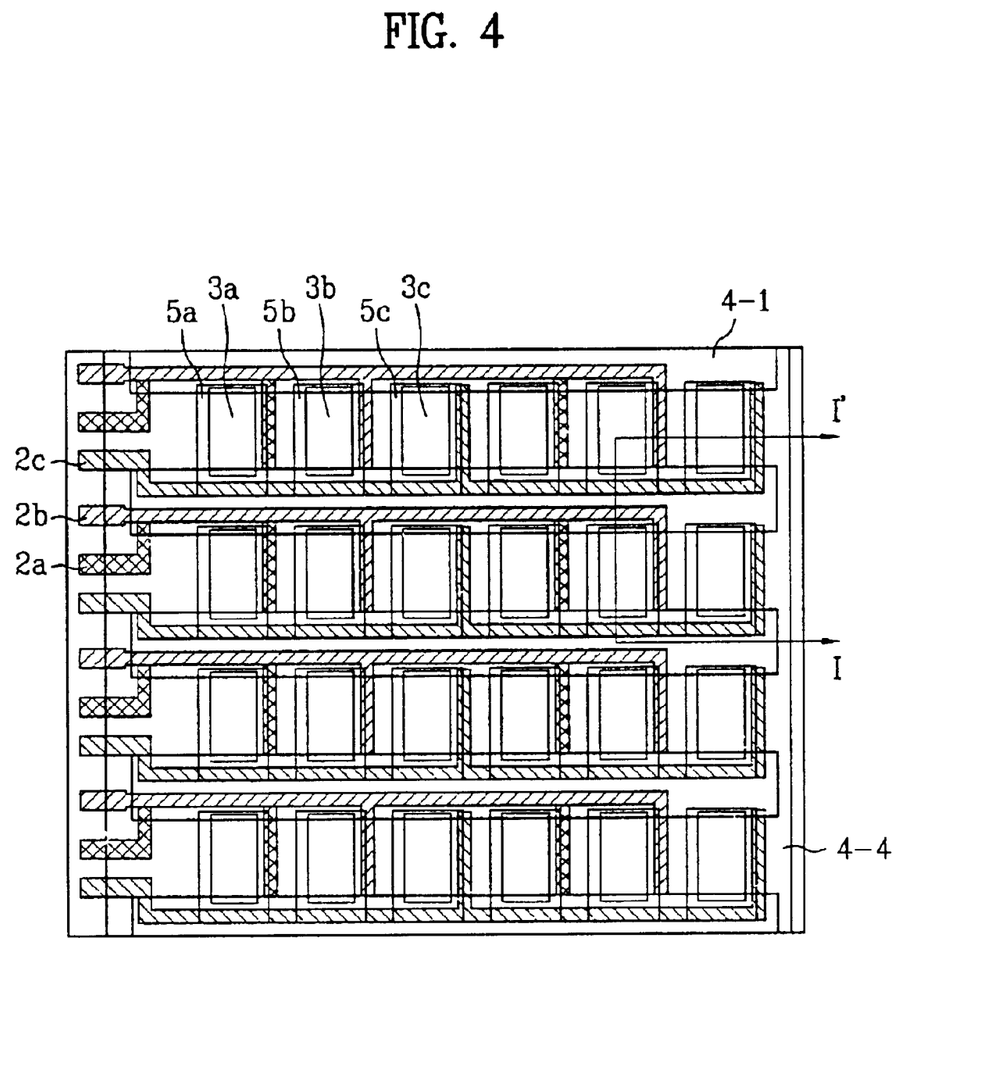
FIGS. 4 and 8 illustrate plan views of organic EL devices of triple scan structure in accordance with a second preferred embodiment of the present invention.
Figure 8:
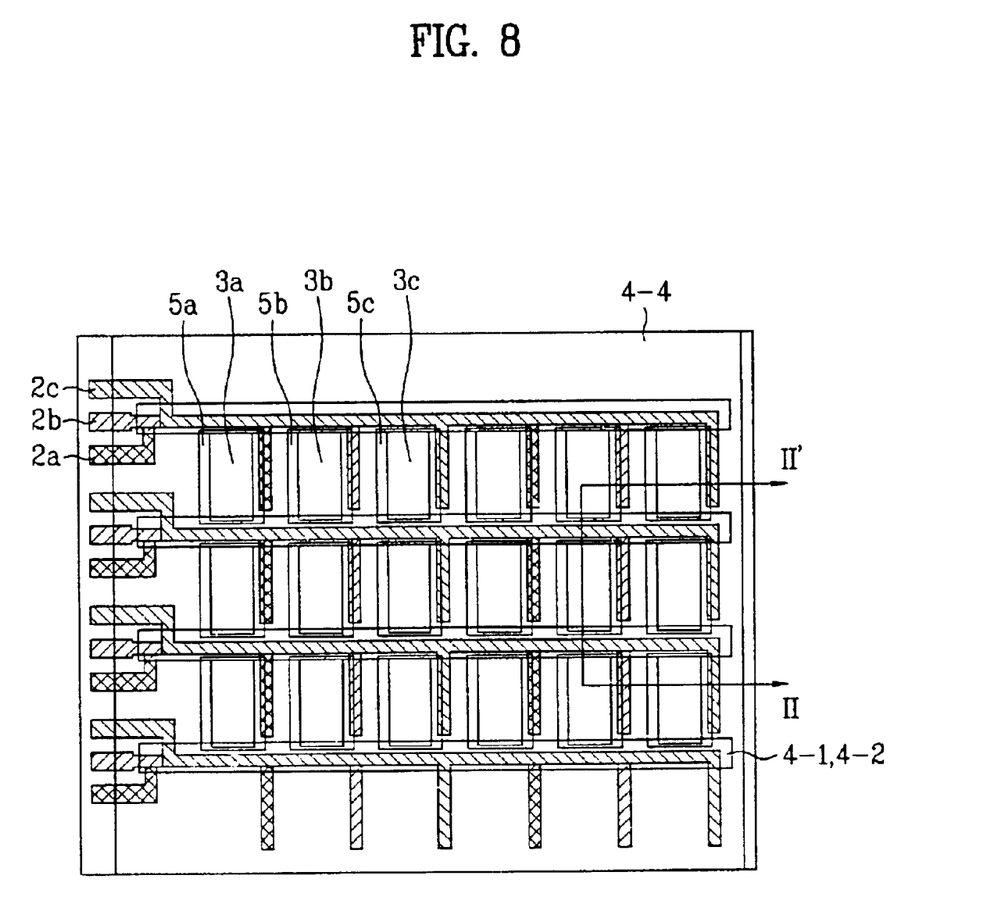

FIG. 4 or 8 illustrates a plan view of an organic EL device of a triple scan structure in accordance with a second preferred embodiment of the present invention, wherein overlapped at least more than two supplementary electrodes are shown, and FIGS. 5A–5C, and 9A–9B, illustrate fabrication processes in I–I', and II–II' direction in FIGS. 4 and 8, respectively.

The second embodiment of the present invention is characterized in that at least two lines of the three supplementary electrodes 2a, 2b, and 2c are overlapped. That is, the second embodiment has overlapped supplementary electrodes to form a multi-layered structure for increasing a numerical aperture of a pixel, in a case micro sized pixels are formed, when the multi-layered supplementary electrodes have the same thicknesses and widths, and are overlapped in up and down direction.

First, FIG. 4 illustrates bi-layered supplementary electrode formed by overlapping two lines of supplementary electrodes, and an insulating film formed between the overlapped supplementary electrodes, a system of which is almost same with the first embodiment, and explanation of which will be omitted.

Referring to FIG. 4, of the three lines of supplementary electrodes, supplementary electrodes 2a, and 2b are overlapped, and an insulating film 4-1 is formed between the overlapped two lines of supplementary electrodes 2a and 2b, to isolate the two lines of supplementary electrodes 2a, and 2b, electrically. When a scan signal is provided to one of the plurality of scanlines, and a data signal is provided to the first electrodes 5a, 5b, and 5c in contact with the three lines of supplementary electrodes 2a, 2b, and 2c individually, the organic EL layer over the first electrodes 5a, 5b, and 5c emits a light. In this instance, a time period of the light emission is three times of the case there is one line of supplementary electrode. Since the two lines of supplementary electrodes 2a, and 2b are overlapped, an area of the first electrode is expanded, that further increases a luminous efficiency of the pixel.

A method for fabricating the foregoing organic EL device will be explained, with reference to FIGS. 4, and 5A–5D.

Figure 5A:
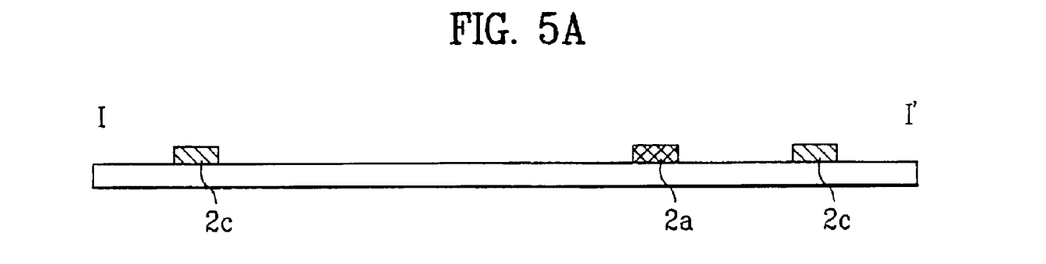
FIGS. 5A–5D, 9A, and 9B illustrate sections across lines I–I', and II–II' in FIGS. 4 and 8 respectively showing the steps of a method for fabricating an organic EL device in accordance with a second preferred embodiment of the present invention.

Referring to FIG. 5A, two lines of supplementary electrodes 2a, and 2c are formed on a transparent substrate 1, each of which has a stripe pattern and a projected part in connection with the stripe pattern.

Figure 5B:
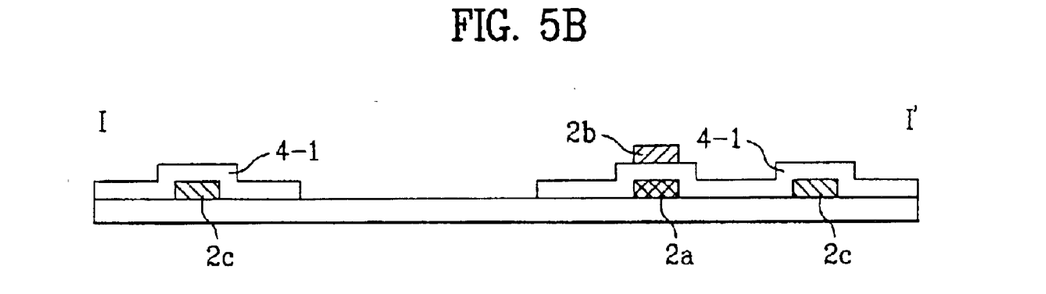

Then, referring to FIG. 5B, an insulating film 4-1 is formed on the supplementary electrodes 2a, and 2c, and the supplementary electrode 2b is formed on the insulating film 4-1 such that the supplementary electrode 2b has a stripe pattern and a projected part in connection with the stripe pattern, to overlap the two supplementary electrodes 2a, and 2b.

Figure 5C:
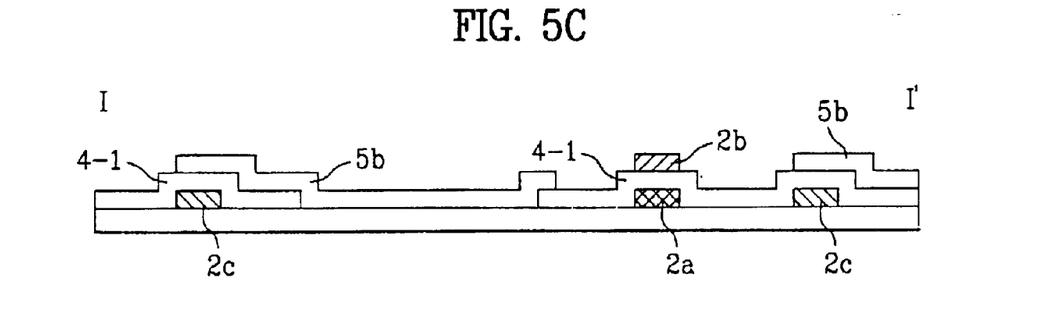

Referring to FIG. 5C, a transparent conductive material is patterned such that the transparent conductive material is connected to the three lines of supplementary electrodes 2a, 2b, and 2c, to form a first electrodes 5a, 5b, and 5c.

Figure 5D:
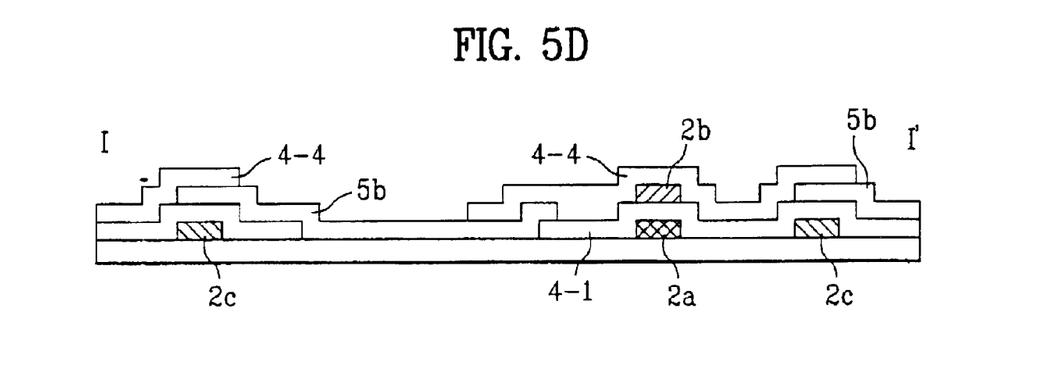

Referring to FIG. 5D, an insulating film 4—4 is formed on the transparent substrate such that the insulating film 4—4 cover edge parts of the first electrodes 5a, 5b, and 5c patterns.

Then, in order to connect three pixel groups each arranged in one direction to an external scanline (not shown) for scan driving the three pixel groups on the same time, a barrier 6 is formed for every three pixel groups for electrical isolation of the three pixel groups, and an organic EL layer is formed on the first electrodes 5a, 5b, and 5c.

That is, one barrier 6 is formed for every three pixel 3a, 3b, and 3c groups arranged in a direction perpendicular to the supplementary electrodes 2a, 2b, and 2c, and a second electrode (not shown) is formed on the organic EL layer, which is passivated, and encapsulated, to finished fabrication of a display.

The method further includes a step for connecting a scanline (not shown) to every adjacent three pixel groups arranged in a direction perpendicular to the supplementary electrodes 2a, 2b, and 2c so that the three adjacent pixel groups arranged in one direction are connected to one scanline for being driven on the same time.

Figure 6:
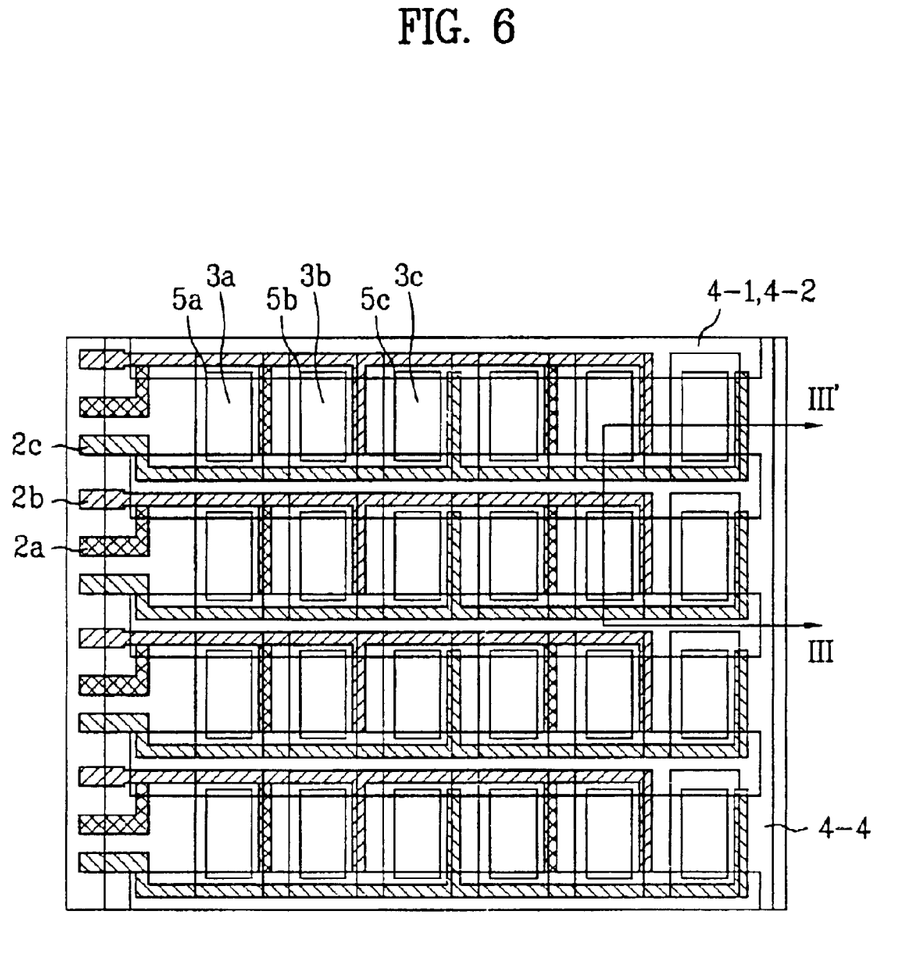
FIG. 6 illustrates a plan view of an organic EL device of triple scan structure in accordance with another preferred embodiment of FIG. 4.

FIG. 6 illustrates another embodiment of FIG. 4, wherein a plan view of an organic EL device of triple scan structure is shown, and FIGS. 7A–7E illustrate a fabrication process in III–III' direction in FIG. 6.

Figure 7A:
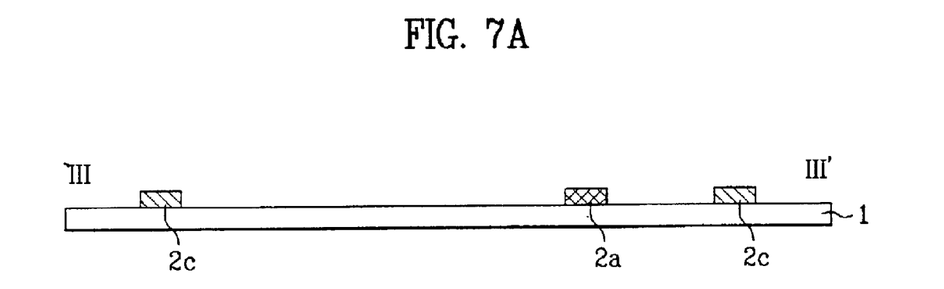
FIGS. 7A–7E illustrate sections across a line III—III in FIG. 6 showing the steps of a method for fabricating an organic EL device of triple scan structure in accordance with another preferred embodiment of the present invention.
Figure 7B:
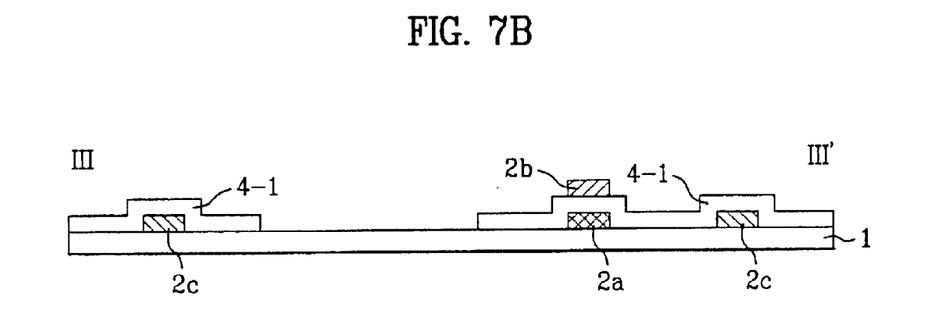
Figure 7C:
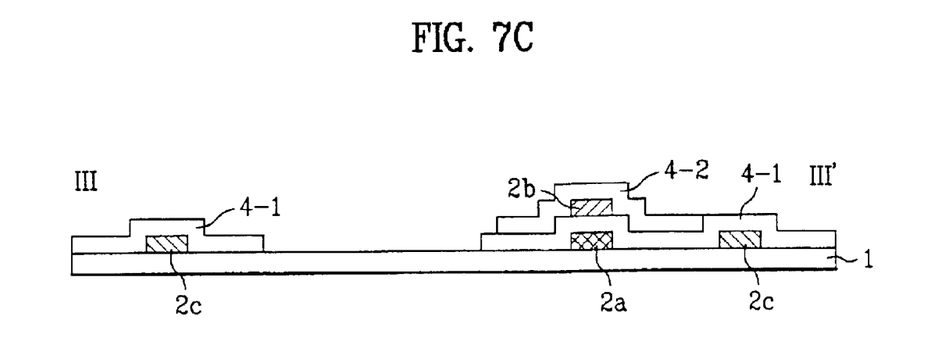
Figure 7D:
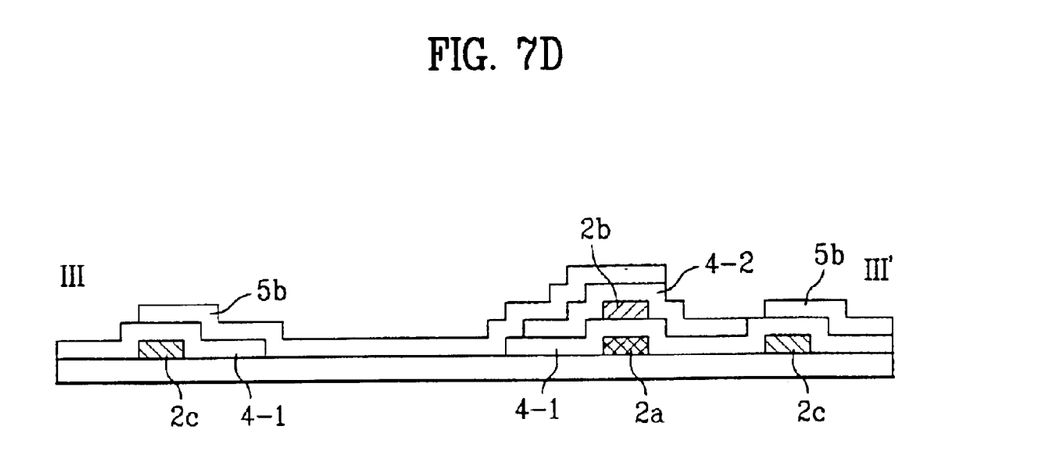
Figure 7E:
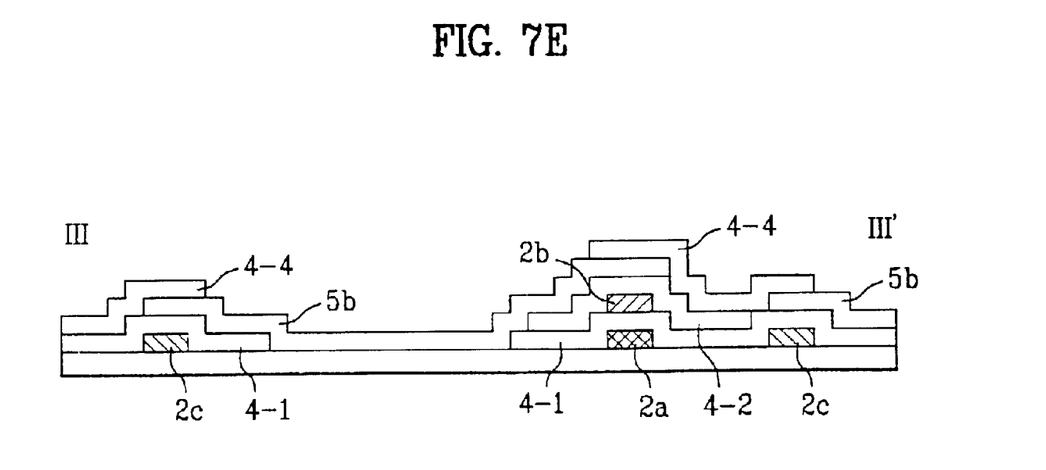

Referring to FIGS. 6 and 7C, an insulating film 4-2 is formed, not only between the overlapped two lines of supplementary electrodes 2a, and 2b, but also a location over the supplementary electrode 2b additionally, for increasing areas of the first electrodes 5a, 5b, and 5c.

Explanations on a system and a method with respect to FIG. 6 will be omitted since the system is almost same with a system in FIG. 4, and the method is also the same except that the insulating film 4-2 is formed.

Second, FIG. 8 illustrates three lines of overlapped supplementary electrodes to form tri-layered supplementary electrodes, and an insulating film formed additionally between the overlapped supplementary electrodes, of which explanation will be omitted since a system of FIG. 8 is almost same with the first embodiment.

Figure 9A:
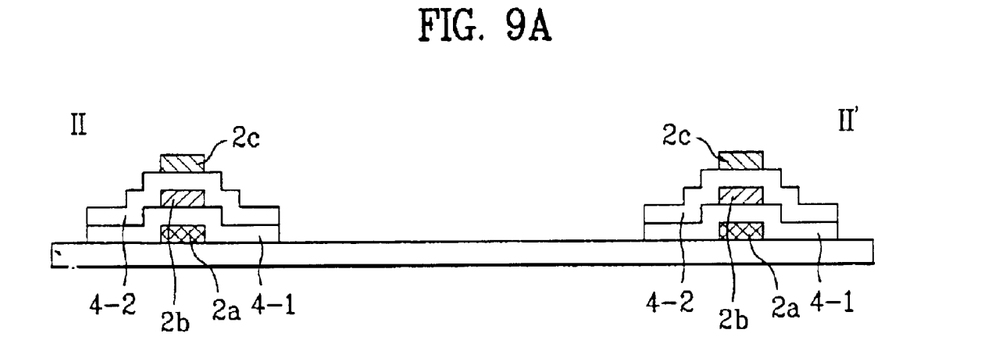
Figure 9B:
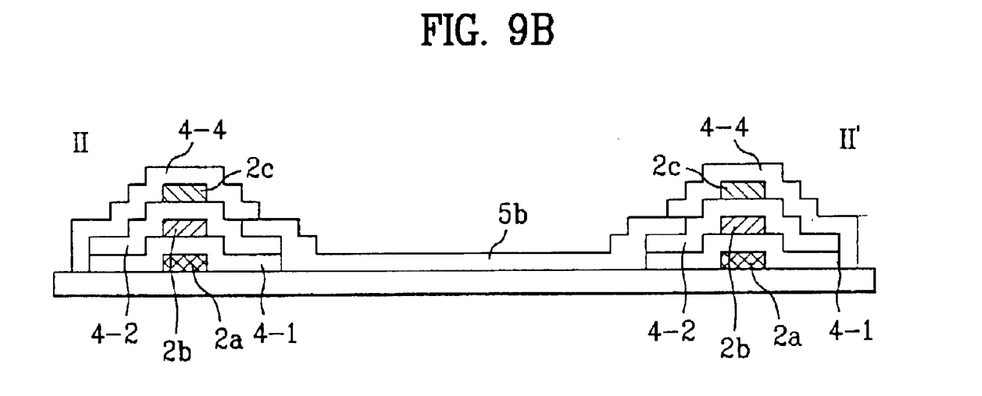

Referring to FIGS. 8 and 9, all the three lines of supplementary electrodes 2a, 2b, and 2c are overlapped. An insulating film 4-1, or 4-2 is formed between the supplementary electrodes 2a, 2b, and 2c, for isolating the three lines of supplementary electrodes 2a, 2b, and 2c electrically. When a scan signal is provided to one of a plurality of scanlines, and a data signal is provided to the first electrodes 5a, 5b, and 5c in contact with the three lines of supplementary electrodes 2a, 2b, and 2c individually, the organic EL layer over the first electrodes 5a, 5b, and 5c emits a light. In this instance, a time period of the light emission is three times of the case there is one line of supplementary electrode.

Moreover, the overlapped three lines of supplementary electrodes 2a, 2b, and 2c increases areas of the first electrodes 5a, 5b, and 5c, that enhances the luminous efficiency of the pixel, further.

Figure 10:
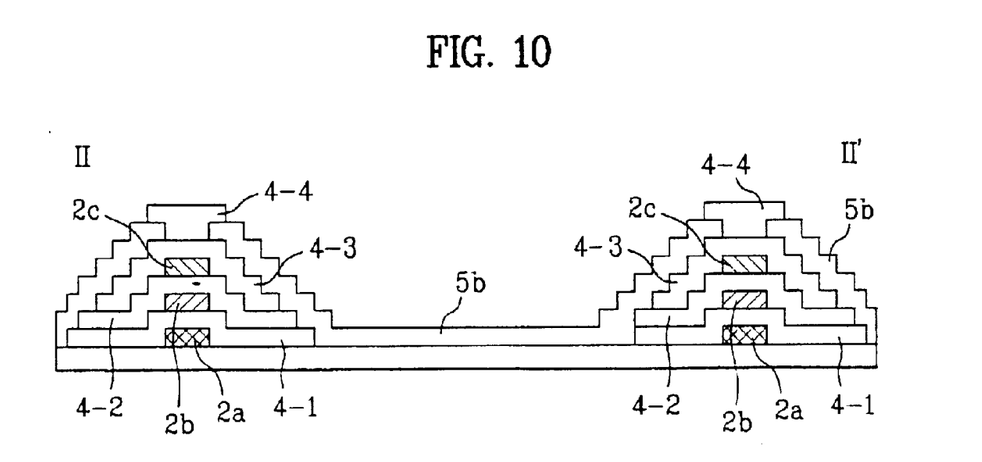
FIG. 10 illustrates a section of an organic EL device of triple scan structure in accordance with another preferred embodiment of FIG. 8.

FIG. 10 illustrates another embodiment of FIG. 8, wherein a plan view of an organic EL device of triple scan structure is shown.

FIG. 10 has a system almost same with FIG. 8, and, as shown in FIG. 10, an insulating film 4-3 is formed, not only between the three lines of overlapped supplementary electrodes 2a, 2b, and 2c, but also at a part over the supplementary electrode 2c, for increasing areas of the first electrodes 5a, 5b, and 5c.

Figure 11:
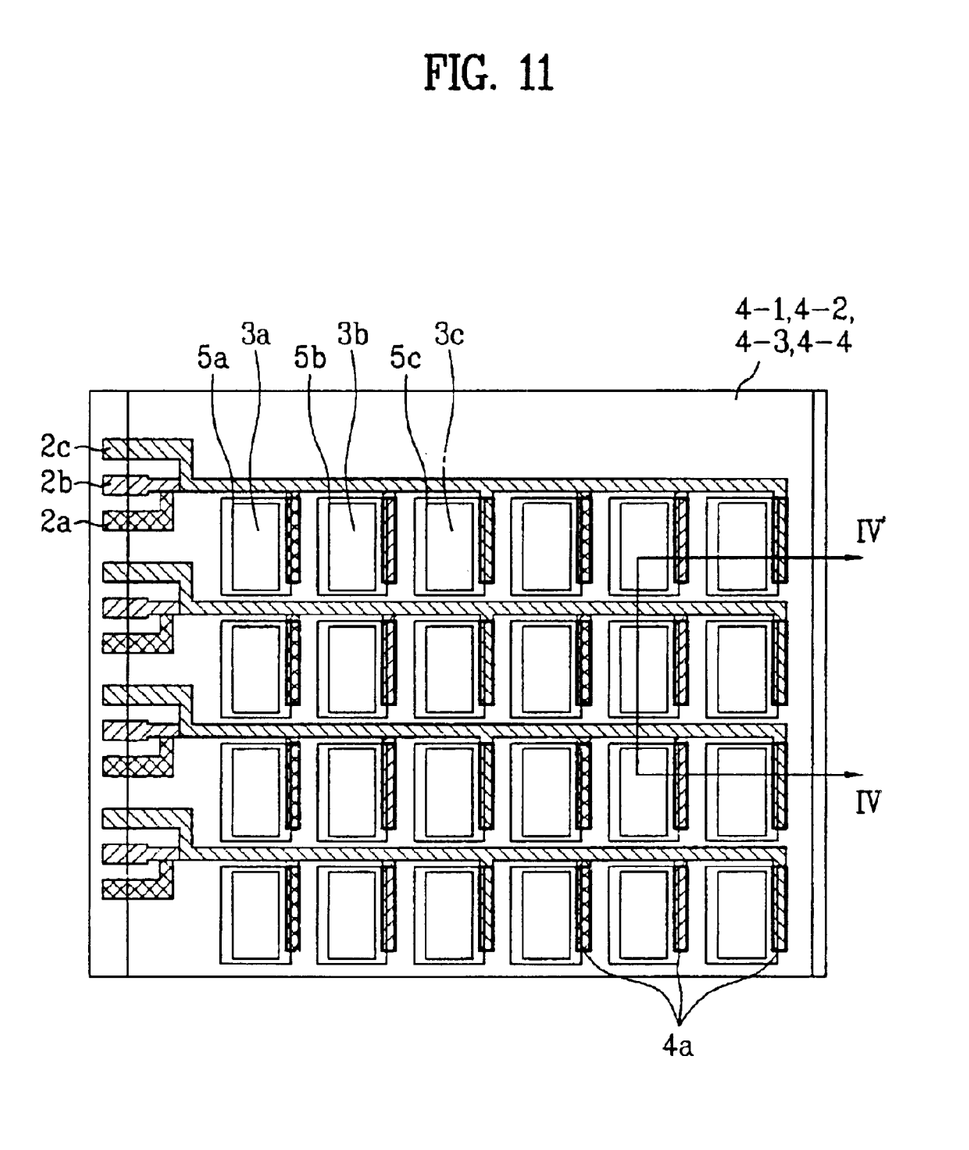
FIG. 11 illustrates a plan view of an organic EL device of triple scan structure in accordance with another preferred embodiment of FIG. 8.
Figure 12:
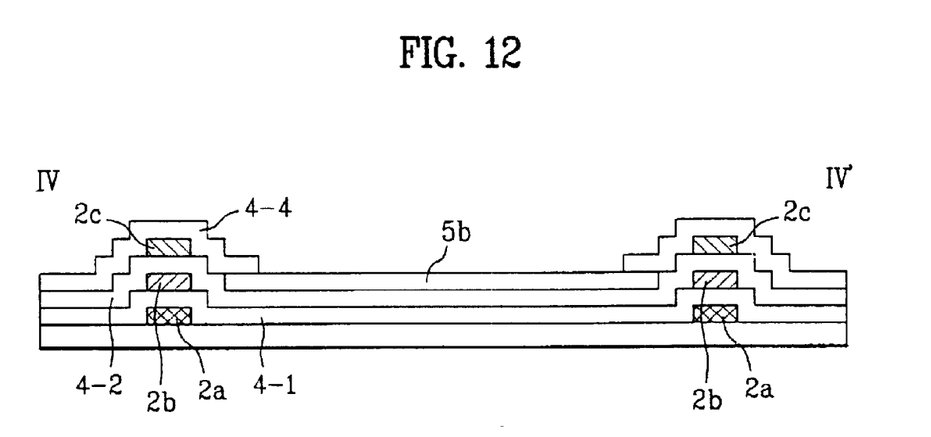
FIG. 12 illustrates a section across a line IV–IV' in FIG. 11.

FIG. 11 illustrates another embodiment of FIG. 8, wherein a plan view of an organic EL device of triple scan structure is shown, and FIG. 12 illustrates a section in IV–IV' direction in FIG. 12.

FIG. 11 illustrates overlapped insulating films 4-1 and 4-2 with via holes 4a extended to a transparent substrate such that the first electrodes 5a, 5b, and 5c are in contact with the supplementary electrodes 2a, 2b, and 2c formed at the adjacent three pixels through the via holes 4a.

Figure 13:
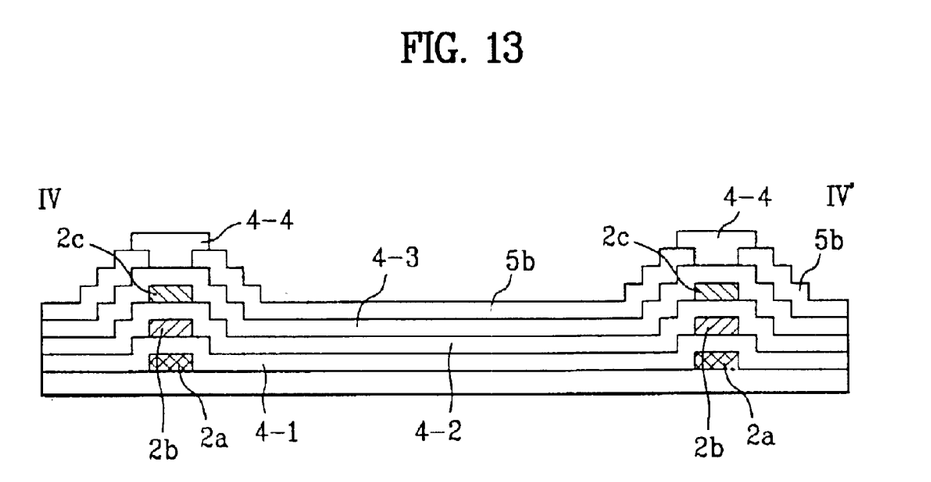
FIG. 13 illustrates a section of an organic EL device of triple scan structure in accordance with another preferred embodiment of FIG. 11.

FIG. 13 illustrates another embodiment of FIG. 11, wherein a section of an organic EL device of triple scan structure is shown, having an insulating film 4-3 formed, not only between the three lines of supplementary electrodes 2a, 2b, and 2c, but also at a part over the supplementary electrode 2c additionally, for increasing areas of the first electrodes 5a, 5b, and 5c.

In the first, second, or third embodiment, when the scan signal is provided to the scanline electrically connected to the second electrode isolated by the barrier 6, and the data signal is provided to the supplementary electrodes 2a, 2b, and 2c formed under the second electrode perpendicular to the second electrode, the data signal is provided to the first electrodes 5a, 5b, and 5c electrically connected to the supplementary electrodes 2a, 2b, and 2c, to make the pixels 3a, 3b, and 3c to emit lights.

Since one time of scan makes the three pixels 3a, 3b, and 3c to emit lights, a light emission time period increases by two times, and a number of scanlines are reduced by half.

As a material of the supplementary electrodes 2a, 2b, and 2c in the first, second, or third embodiment, it is acceptable as far as the material is conductive, particularly, Cr, Mo, Al, Cu, or an alloy of them, may be used, or two of them may be used on the same time. The supplementary electrodes 2a, 2b, and 2c may be 0.01–10 $\mu$m thick, and line widths different depending on devices.

As a material of the insulating film 4-1, 4-3, or 4—4, inorganic, or organic material, such as oxides $SiO_2$, or nitrides SiNx, as the inorganic material, or polymers (particularly, polyacryl group, polyimide group, novolac, polyphenyl, polystyrene) as the organic material are acceptable. The insulating film may have a thickness in a range of 0.01–10 $\mu$m, and it is preferable that the material of the insulating film has a low light absorbance with respect to visible lights.

The insulating films 4-1, 4-3, and 4—4 may, or may not, be formed of the same material.

The insulating film 4—4 is formed so as to cover edge parts of the first electrodes 5a, 5b, and 5c, which are liable to damage during fabrication for prevention of short circuit between the first electrodes 5a, 5b, and 5c and the second electrode.

The first electrodes 5a, 5b, and 5c are transparent, and the second electrode is formed of a metal.

As has been explained, the organic EL device of triple scan structure of the present invention has the following advantages.

By employing a method in which a supplementary electrode is divided in three parts, not in a length direction, but in a width direction, for reducing a number of scanlines, and a number of data chips are reduced, a time period one pixel emits a light is increased by three times, to enhance a pixel luminous efficiency.

Moreover, by overlapping at least two of three lines of supplementary electrodes, which are electrically connected to a first electrode, and insulating the supplementary electrodes by means of insulating films such that each pixel group is controlled by the three lines of supplementary electrodes individually, areas of the supplementary electrodes on the transparent substrate are reduced, and the first electrode, a transparent electrode, is formed to have a larger area, to increase a pixel numerical aperture, thereby enhancing a pixel luminous efficiency.

It will be apparent to those skilled in the art that various modifications and variations can be made in the organic EL (electroluminescence) device of the present invention without departing from the spirit or scope of the invention. Thus, it is intended that the present invention cover the modifications and variations of this invention provided they come within the scope of the appended claims and their equivalents.

What is claimed is:

1. An organic EL (electroluminescence) device comprising:
   a plurality of data electrode lines on a substrate;
   a plurality of scan electrode lines perpendicular to the data electrode lines; and
   an organic EL layer between the plurality of data electrode lines and the plurality of scan electrode lines,
   wherein each of the data electrode lines is patterned, and divided into three electrode lines, for scanning three pixel groups at a time.

2. An organic EL device as claimed in claim 1, wherein each of the data electrode lines includes:
   the three electrode lines perpendicular to a scan electrode line direction; and
   main electrode lines connected to the three electrode lines capable of driving pixels.

3. The organic EL device as claimed in claim 1, wherein the three electrode lines of each data electrode line are formed of a conductive material wherein said conductive material comprises, Cr, Mo, Al, Cu, or an alloy of two or more than two of the conductive materials.

4. The organic EL device as claimed in claim 1, wherein the three electrode lines comprise at least two parallel electrode lines between a pair of barriers.

5. The organic EL device as claimed in claim 1, wherein the three electrode lines divided from each data electrode line comprise:
   first and second supplementary electrode lines on one plane;
   a second insulating film on the first and second supplementary electrode lines; and
   a third supplementary electrode line on the second insulating film overlapped at least one of the first or second supplementary electrode lines.

6. The organic EL device as claimed in claim 5, wherein the three electrode lines further comprise:
   at least one additional insulating film.

7. The organic EL device as claimed in claim 1, wherein the three electrode lines comprise:
   a first supplementary electrode line;
   a second insulating film on the first supplementary electrode line;
   a second supplementary electrode line on the second insulating film;
   a third insulating film on the second supplementary electrode line; and
   a third supplementary electrode line on the third insulating film.

8. An organic EL device as claimed in claim 7, wherein the three electrode lines further comprises:
   a fourth insulating film on the third supplementary electrode line.

9. The organic EL device as claimed in claim 1, wherein the supplementary electrode lines have widths different from one another.

10. The organic EL device as claimed in claim 1, wherein more than one electrode line of the three electrode lines in each data electrode line are electrically driven at the same time.

11. The device of claim 1, wherein each supplementary electrode is divided into three parts by at least two barriers, wherein a signal to a supplementary electrode causes a signal to said three parts of said supplementary electrodes at the same time increasing a time period of emission by three times.

12. The device of claim 1, wherein said substrate has a length direction and a width direction, wherein said length direction is approximately parallel to a barrier direction, wherein said width direction crosses said length direction and is approximately parallel to portions of said three electrode lines of each data electrode line, wherein each of the three electrode lines is divided in its width direction three times, and wherein each of said three divided parts of each of the three electrode lines is in communication with a pixel.

13. A device, comprising:
   data electrode lines on a substrate, wherein each of said data electrode lines comprises at least two supplementary electrodes with at least one insulating layer, wherein at least one supplementary electrode and at least one insulating layer is between at least one other supplementary electrode and said substrate wherein each of said data electrode lines comprises at least three supplementary electrodes with at least two insulating layers, wherein at least two supplementary electrodes and at least two insulating layers are between at least one other supplementary electrode and said substrate.

14. The device of claim 13, wherein said device is an organic electroluminescent (EL) device and data signals are provided to said device to emit light, and wherein each data signal causes pixels in adjacent groups of pixels separated by barriers and attached to each supplementary electrode to illuminate across said barriers at the same time.

15. A device, comprising:
   data electrode lines on a substrate, wherein each of said data electrode lines comprises at least two supplementary electrodes with at least one insulating layer, wherein at least one supplementary electrode and at least one insulating layer is between at least one other supplementary electrode and said substrate, wherein each supplementary electrode is divided into three parts by at least two barriers, wherein a signal to a supplementary electrode causes a signal to said three parts of said supplementary electrodes at the same time increasing a time period of emission by three times.

16. A device, comprising:
   data electrode lines on a substrate, wherein each of said data electrode lines comprises at least two supplementary electrodes with at least one insulating layer, wherein at least one supplementary electrode and at least one insulating layer is between at least one other supplementary electrode and said substrate, wherein said substrate has a length direction and a width direction, wherein said length direction is approximately parallel to a barrier direction, wherein said width direction crosses said length direction and is approximately parallel to portions of said supplementary electrodes, wherein each supplementary electrode is divided in its width direction three times, and wherein each of said three divided parts of each supplementary electrode is in communication with a pixel.

17. A device, comprising:

data electrode lines on a substrate, wherein each of said data electrode lines comprises at least two supplementary electrodes with at least one insulating layer, wherein at least one supplementary electrode and at least one insulating layer is between at least one other supplementary electrode and said substrate, wherein said device is an organic electroluminescent (EL) display device further comprising:

scan electrode lines crossing said data electrode lines;

an organic EL layer between said data electrode lines and said scan electrode lines; and barriers between portions of said data electrode lines, wherein said barriers are approximately perpendicular to said supplementary electrodes.

* * * * *